(12) United States Patent
Kimata

(10) Patent No.: US 8,485,343 B2
(45) Date of Patent: Jul. 16, 2013

(54) CONVEYING SYSTEM HAVING ENDLESS DRIVE MEDIUM AND CONVEYING METHOD

(75) Inventor: Tomoya Kimata, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 48 days.

(21) Appl. No.: 13/322,644

(22) PCT Filed: Jun. 2, 2009

(86) PCT No.: PCT/JP2009/060074
§ 371 (c)(1),
(2), (4) Date: Nov. 28, 2011

(87) PCT Pub. No.: WO2010/140219
PCT Pub. Date: Dec. 9, 2010

(65) Prior Publication Data
US 2012/0067698 A1    Mar. 22, 2012

(51) Int. Cl.
*B65G 43/00*    (2006.01)
(52) U.S. Cl.
USPC ............. 198/465.4; 198/341.02; 198/345.3; 198/346.3; 198/464.1; 198/485.1
(58) Field of Classification Search
USPC ............ 198/341.02, 345.3, 346.3, 464.1, 198/464.3, 465.4, 465.1, 468.6, 485.1, 810.03, 198/575, 577; 414/940, 217
See application file for complete search history.

(56) References Cited

U.S. PATENT DOCUMENTS

| | | | |
|---|---|---|---|
| 4,589,184 A | 5/1986 | Asano et al. | |
| 4,805,759 A | 2/1989 | Rochet et al. | |
| 5,203,445 A * | 4/1993 | Shiraiwa | 198/464.3 |
| 6,699,329 B2 * | 3/2004 | Mueller et al. | 118/641 |
| 7,137,769 B2 * | 11/2006 | Komatsu et al. | 414/222.01 |
| 7,230,702 B2 * | 6/2007 | Rice et al. | 356/400 |
| 7,234,584 B2 | 6/2007 | Rice et al. | |
| 7,912,576 B2 * | 3/2011 | Rice et al. | 700/230 |
| 2004/0062633 A1 | 4/2004 | Rice et al. | |
| 2005/0095110 A1 * | 5/2005 | Lowrance et al. | 414/736 |

FOREIGN PATENT DOCUMENTS

| | | |
|---|---|---|
| JP | 61-150878 A | 7/1986 |
| JP | 62-502503 A | 9/1987 |
| JP | 02-023109 A | 1/1990 |
| JP | 05-008854 A | 1/1993 |
| JP | 2004-134765 A | 4/2004 |

OTHER PUBLICATIONS

Official Communication issued in International Patent Application No. PCT/JP2009/060074, mailed on Jul. 21, 2009.

(Continued)

*Primary Examiner* — Mark A Deuble
(74) *Attorney, Agent, or Firm* — Keating & Bennett, LLP

(57) ABSTRACT

In a transport system, a plurality of carriers are attached to an endless belt configured to rotate in a circulating manner. At a station, a hand, a driver configured to move the hand in a rotation direction and a vertical direction, a first carrier sensor configured to detect the carriers at a predetermined position upstream of the hand along the rotation direction of the endless driving medium, and a second carrier sensor configured to detect the carriers at a position downstream of the first carrier sensor are provided. When the carriers pass through the second carrier sensor, it is checked whether the moving distance of the belt matches the distance between the two carrier sensors. In this manner, before starting loading or unloading, for example, whether the encoder is operated normally or not can be confirmed.

5 Claims, 9 Drawing Sheets

OTHER PUBLICATIONS

Kimata, "Conveying System Having Endless Drive Medium and Method for Delivering/Receiving Article Therein", U.S. Appl. No. 13/322,589, filed Nov. 28, 2011.

Kimata, "Conveying System Having Endless Drive Medium, Method for Identifying Carrier Thereof, and Carrier", U.S. Appl. No. 13/322,591, filed Nov. 28, 2011.

* cited by examiner

F I G. 4
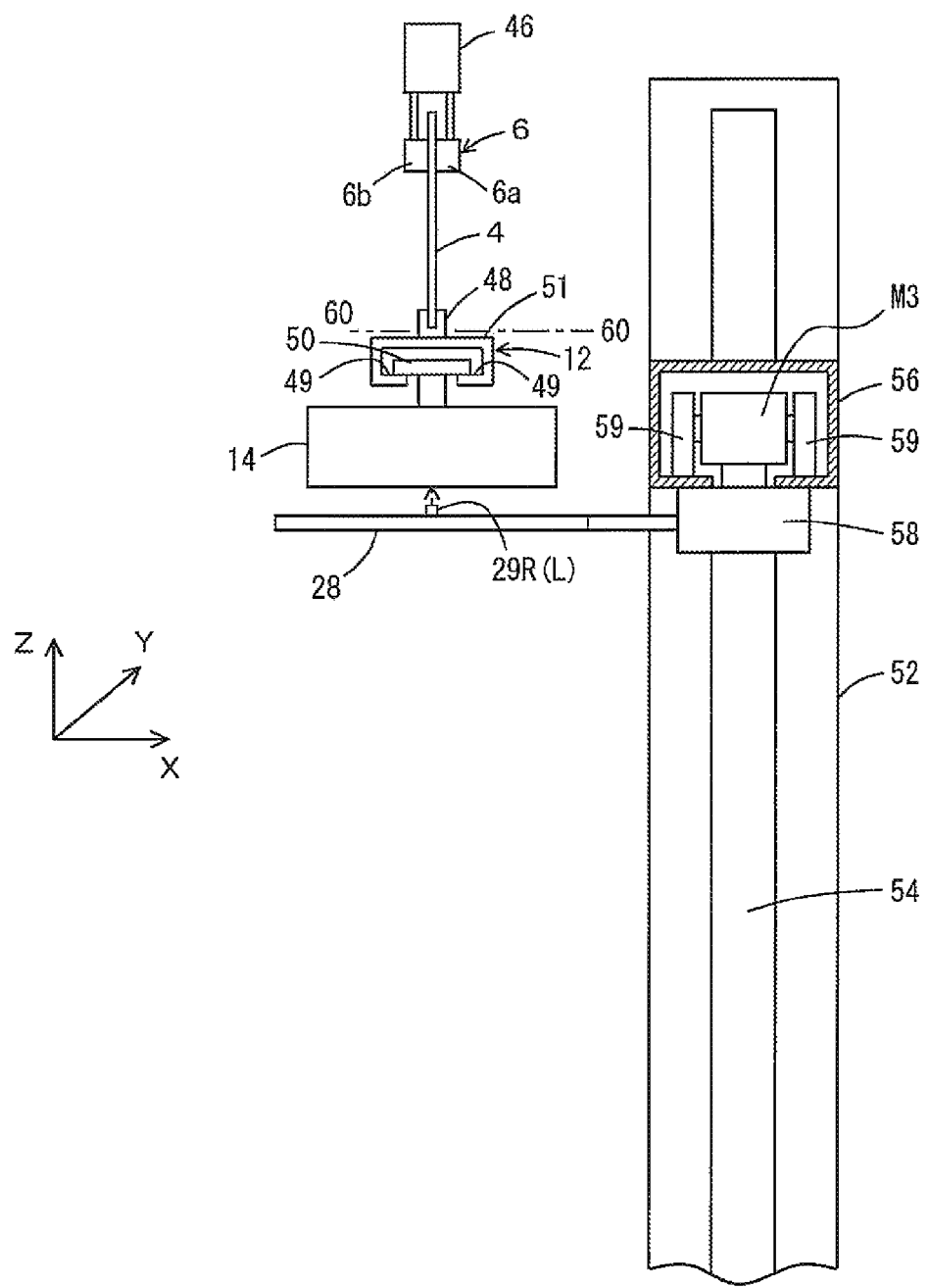

F I G. 1 0
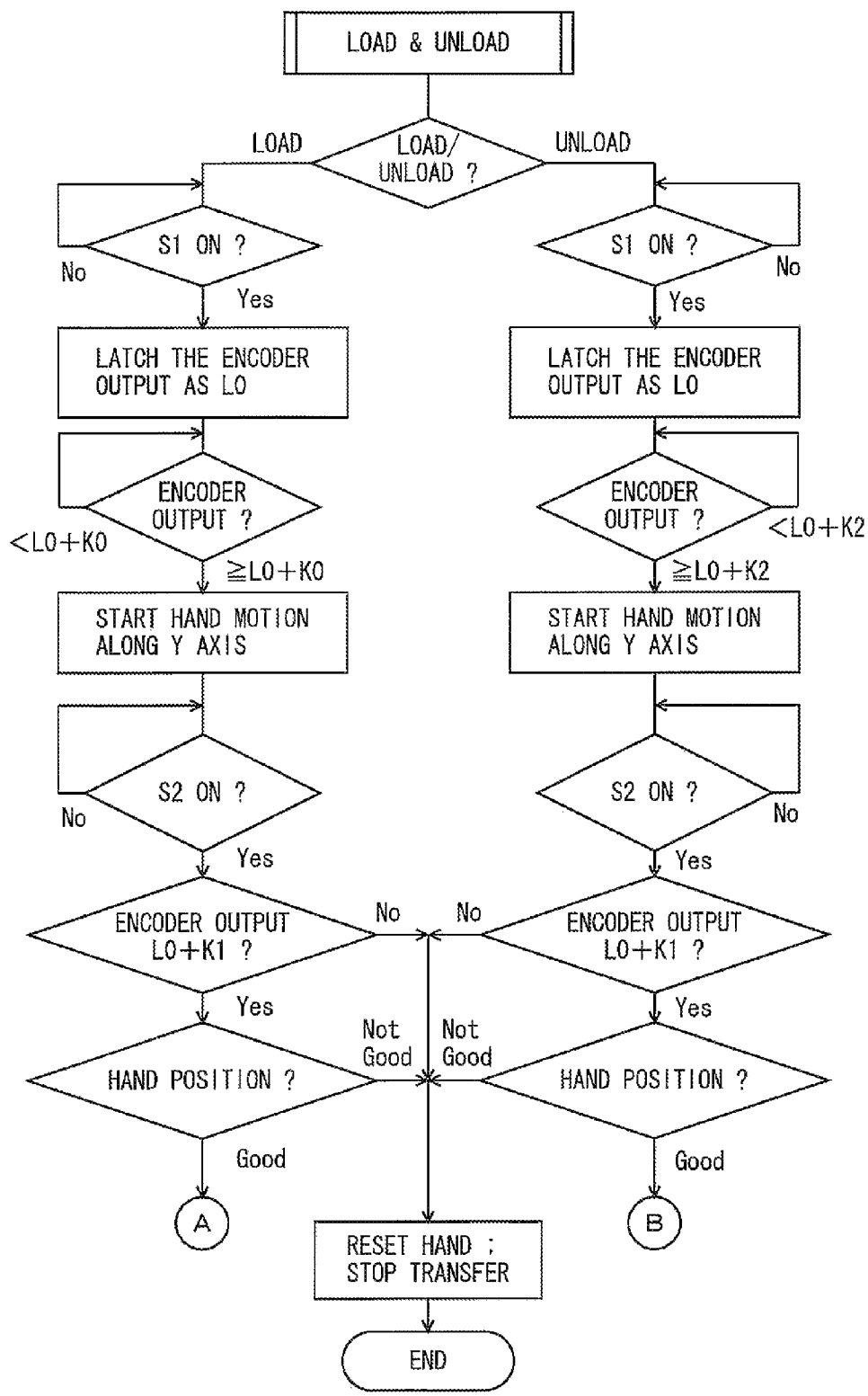

CONVEYING SYSTEM HAVING ENDLESS DRIVE MEDIUM AND CONVEYING METHOD

BACKGROUND OF THE INVENTION

1. Field of the Invention

The present invention relates to a transport system that transports semiconductor substrates or other articles via a carrier attached to an endless driving medium. In particular, the present invention relates to a technique of detecting a position of a carrier configured to carry articles such as semiconductor substrates or other articles, and driving a hand of a station.

2. Description of the Related Art

According to U.S. Pat. No. 7,234,584, a plurality of carriers are attached to an endless belt, and the endless belt rotates in a circulating manner. Each of the carriers has a support surface for supporting a flange or the like of a semiconductor cassette, and the cassette is loaded or unloaded using a hand of a station. Further, a sensor for detecting the carriers and an encoder for measuring moving distance of the belt are provided to control the hand. In U.S. Pat. No. 7,234,584, the hand is driven immediately after detection of the carrier by the sensor. Therefore, the hand is driven at the same timing in both of loading and unloading. However, if the hand is driven immediately after detection of the carrier, the delay in the signal processing appears as a control delay.

SUMMARY OF THE INVENTION

Preferred embodiments of the present invention check whether a carrier is operated normally or not before loading articles from a hand to a carrier or unloading articles from a carrier to a hand.

Also, preferred embodiments of the present invention check operation of a carrier immediately before loading or unloading of articles.

In addition, preferred embodiments of the present invention check whether a hand is operated normally or not immediately before loading or unloading of articles.

A transport system according to a preferred embodiment of the present invention includes an endless driving medium configured to rotate in a circulating manner; a plurality of carriers attached to the endless driving medium and configured to hold articles for transportation; a plurality of stations provided along the endless driving medium; and a moving distance sensor configured to measure moving distance of the endless driving medium.

Each of the stations preferably includes a hand configured to load articles to or unload articles from the carrier; a driver configured to move the hand in a rotation direction of the endless driving medium, and move the hand in a vertical direction; a first carrier sensor configured to detect the carrier at a predetermined position upstream of the hand along the rotation direction of the endless driving medium; a second carrier sensor configured to detect the carrier at a position downstream of the first carrier sensor; and a signal processor configured to drive the hand by the driver based on moving distance measured by the moving distance sensor, from a time point of detection of the carrier by the first carrier sensor.

When the second carrier sensor detects the carrier, the signal processor compares a moving distance measured by the moving distance sensor, from a time point of detection of the carrier by the first carrier sensor with a distance between the first carrier sensor and the second carrier sensor, and if a difference between the moving distance and the distance is greater than an allowable value, the signal processor stops movement of the hand by the driver.

For example, the moving distance sensor is preferably provided in each of the stations. Alternatively, the moving distance sensor may be provided in any of a plurality of stations positioned close to one another so that the moving distance sensor can be shared by the stations positioned close to one another. Alternatively, the moving distance sensor may be provided at an intermediate position between adjacent stations so that the moving distance sensor can be shared by the left and right stations.

A transport method according to another preferred embodiment of the present invention includes the steps of attaching a plurality of carriers to an endless driving medium configured to rotate in a circulating manner to hold articles by the carriers for transportation; measuring moving distance of the endless driving medium; providing a hand for the plurality of stations provided along the endless driving medium to allow the hand to load articles to or unload articles from the carrier; detecting the carrier via a first carrier sensor at a predetermined position upstream of the hand along a rotation direction of the endless driving medium; detecting the carrier via a second carrier sensor at a position downstream of the first carrier sensor; driving the hand by the driver based on a moving distance of the endless driving medium, from a time point of detection of the carrier by the first carrier sensor; and when the second carrier sensor detects the carrier, comparing moving distance of the endless driving medium from the time point of detection of the carrier by the first carrier sensor with a distance between the first carrier sensor and the second carrier sensor, and if a difference between the moving distance and the distance is greater than an allowable value, stopping movement of the hand by the driver.

Preferably, the first carrier sensor detects the carrier at a predetermined position downstream of a position of starting movement of the hand (home position), and the hand is driven after detection of the carrier by the first carrier sensor and before detection of the carrier by the second carrier sensor.

More preferably, additionally, a second moving distance sensor configured to measure a moving distance from a position of starting movement of the hand is provided.

When the second carrier sensor detects the carrier, the signal processor compares the moving distance measured by the second moving distance sensor with predetermined moving distance, and if a difference between the measured moving distance and the predetermined moving distance is greater than an allowable value, the signal processor stops movement of the hand by the driver.

Particularly preferably, the hand is driven by the driver to allow the carrier and the hand to pass through the second carrier sensor at a same velocity.

In this specification, description regarding the transport system is directly applicable to the transport method.

In various preferred embodiments of the present invention, the distance between the first carrier sensor and the second carrier sensor is compared with the measured moving distance of the endless driving medium. In this manner, for example, abnormal conditions in the measurement sensor to measure moving distance of the endless driving medium, changes in the rotation velocity of the endless driving medium, abnormal conditions in the first carrier sensor and the second carrier sensor can be detected. Further, since operation of the hand is cancelled if any of these abnormal conditions occur, loading and unloading of articles between the carrier and the hand under the abnormal condition can be prevented.

After activation of the hand, by detecting the carrier using the second carrier sensor, the above abnormal conditions can be checked immediately before loading or unloading.

Further, if the carrier is detected by the second carrier sensor, by comparing the distance from the position of starting movement of the hand with the measured moving distance of the hand, whether the hand is operated normally or not can be checked immediately before starting the motion of loading or unloading the articles.

Further, by allowing the carrier and the hand to pass through the second carrier sensor at the same velocity and at the same time, the subsequent motion of loading or unloading the articles can be started immediately.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a side view showing main components of a carrier and a hand of the station in a preferred embodiment of the present invention.

FIG. 10 is a flow chart showing the former half of an algorithm of loading and unloading in a preferred embodiment of the present invention.

DETAILED DESCRIPTION OF THE PREFERRED EMBODIMENTS

Figure 1:
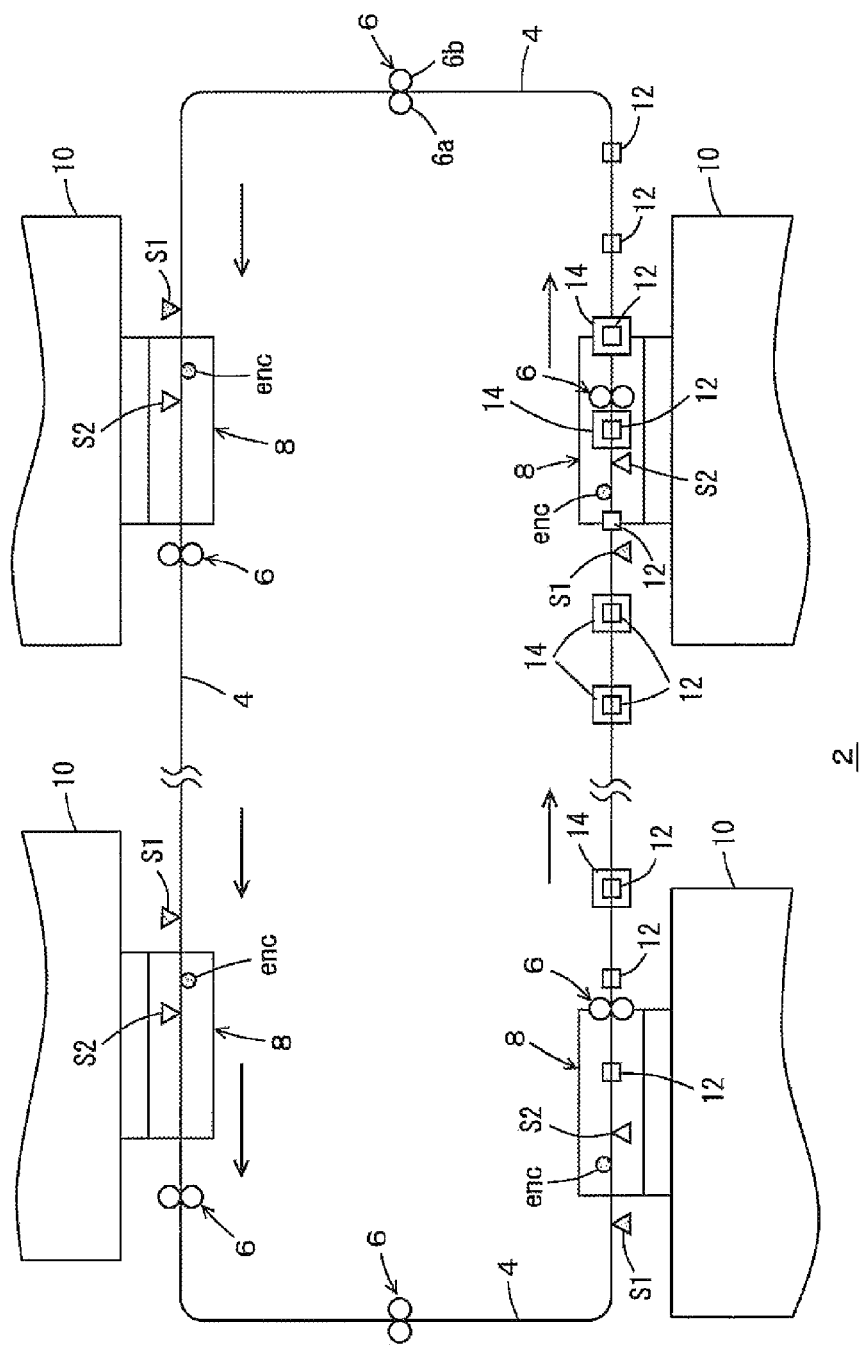
FIG. 1 is a plan view showing a layout of a transport system in a preferred embodiment of the present invention.

Hereinafter, preferred embodiments of the present invention will be described.

FIGS. 1 to 11 show a preferred embodiment and its modifications. In the drawings, a reference numeral 2 denotes a transport system that rotates an endless belt 4 in a circulating manner. Reference numerals 6 denote pulleys that drive the endless belt 4. Reference numerals 6a, 6b denote individual pulley elements. Instead of the belt 4, a chain, a wire, a rope or the like may be used. The belt 4 is rotated in a fixed direction, and a plurality of stations 8 are provided along the belt 4. Buffers (not shown) and processing tools 10 or the like are connected to each station 8. For example, carriers 12 are attached to the belt 4 at constant intervals for transportation of cassettes 14 containing semiconductor substrates or the like. Any type of articles can be transported.

Figure 2:
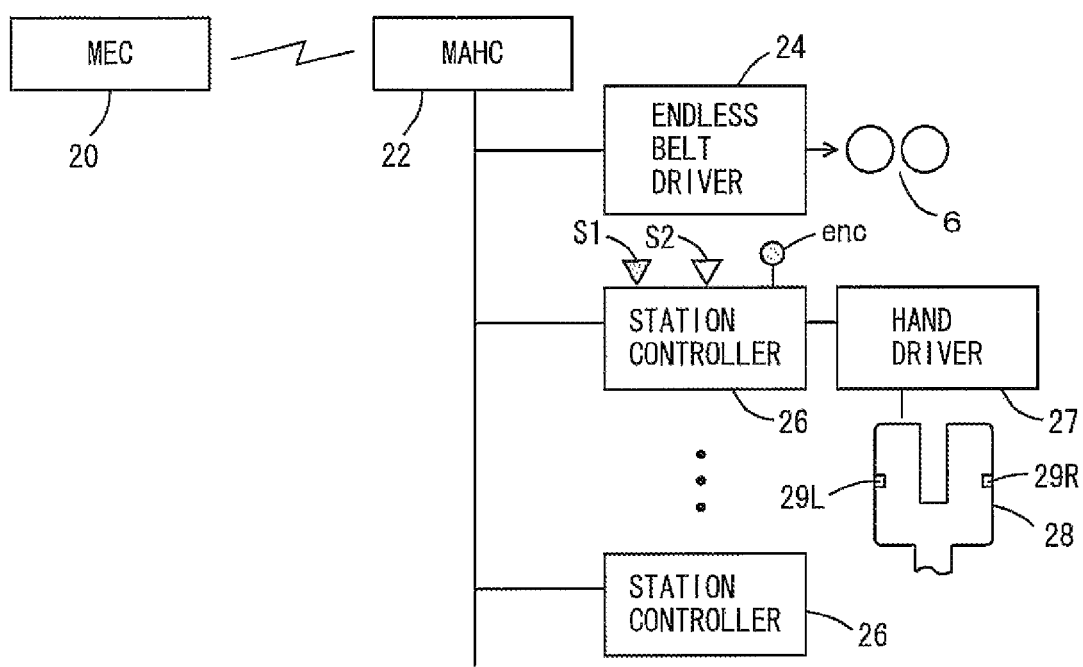
FIG. 2 is a block diagram showing a control system in a preferred embodiment of the present invention.

FIG. 2 shows a control system of the transport system. A reference numeral 20 denotes a manufacturing execution controller. The manufacturing execution controller 20 controls processing tools or the like, and requests a material handling controller 22 to transport the cassettes. The material handling controller 22 controls an endless belt driver 24 and station controllers 26. The station controller 26 is provided for each station. The endless belt driver 24 drives the endless belt 4 at a constant velocity. Inputs to the station controller 26 are transportation instructions from the material handling controller 22. The transportation instructions are issued to load cassettes from, or unload cassettes to a carrier at a predetermined address. A unique address is assigned to each of the carriers along a rotation direction in which the endless belt is rotated. In the preferred embodiment, the address preferably is data having a bit length in a range of 10 to 16 bits, and the address preferably is expressed using a binary value, for example. Loading is a motion to allow the carrier to support the articles, and unloading is a motion to take out the articles from the carrier using a hand.

Detection signals indicating detection of carriers are inputted from two photoelectric sensors s1, s2, to the station controller 26. Among the photoelectric sensors s1, s2, the photoelectric sensor s1 additionally inputs identification signals indicating identification of the carriers to the station controller 26. The travel moving distance of the endless belt is inputted from an encoder enc to the station controller 26. The station controller 26 recognizes an appearance of a carrier at a predetermined position upstream of the station by the signal from the photoelectric sensor s1, and recognizes a type of the carrier, e.g., based on duration of the signal from the photoelectric sensor s1.

The data of the encoder when the carrier is detected by the photoelectric sensor s1 is latched. The difference from the latch value is considered, and the position of watching the photoelectric sensor s1 is regarded as a reference point to recognize the position of the carrier. Further, validity or the like of the data of the encoder is checked by the photoelectric sensor s2 as described later. Based on the data of the encoder, a hand driver 27 is operated, and a hand 28 provided at the station is operated to load cassettes from, and unload cassettes to the carrier. At the time of loading a cassette, the hand 28 holding the cassette is driven, and at the time of unloading a cassette, the hand 28 that does not hold any cassettes is driven. For this purpose, acceleration to accelerate the hand 28 at the time of unloading may be higher than acceleration to accelerate the hand 28 at the time of loading. In this case, the position of driving the hand 28 at the time of unloading is downstream of the position of driving the hand 28 at the time of loading.

A dedicated hand to load articles and a dedicated hand to unload articles may be used. Alternatively, one hand may be used for both of loading and unloading. The hand 28 is a front portion of a transfer device, and any shape and structure can be adopted for the hand 28. For example, occupation sensors 29R, 29L are preferably provided on both of left and right sides of the hand 28. In the case of loading a cassette on a carrier, it is checked whether the carrier supports another cassette or not. In the case of unloading a cassette from a carrier, it is checked whether any cassettes are loaded on the carrier or not. The hand 28 and the endless belt move at the same velocity. Since the hand 28 moves toward the carrier from a position on the front side of the carrier or from a position on the back side of the carrier, a pair of left and right occupation sensors 29R, 29L are used selectively depending on the direction in which the hand 28 moves toward the carrier.

Figure 3:
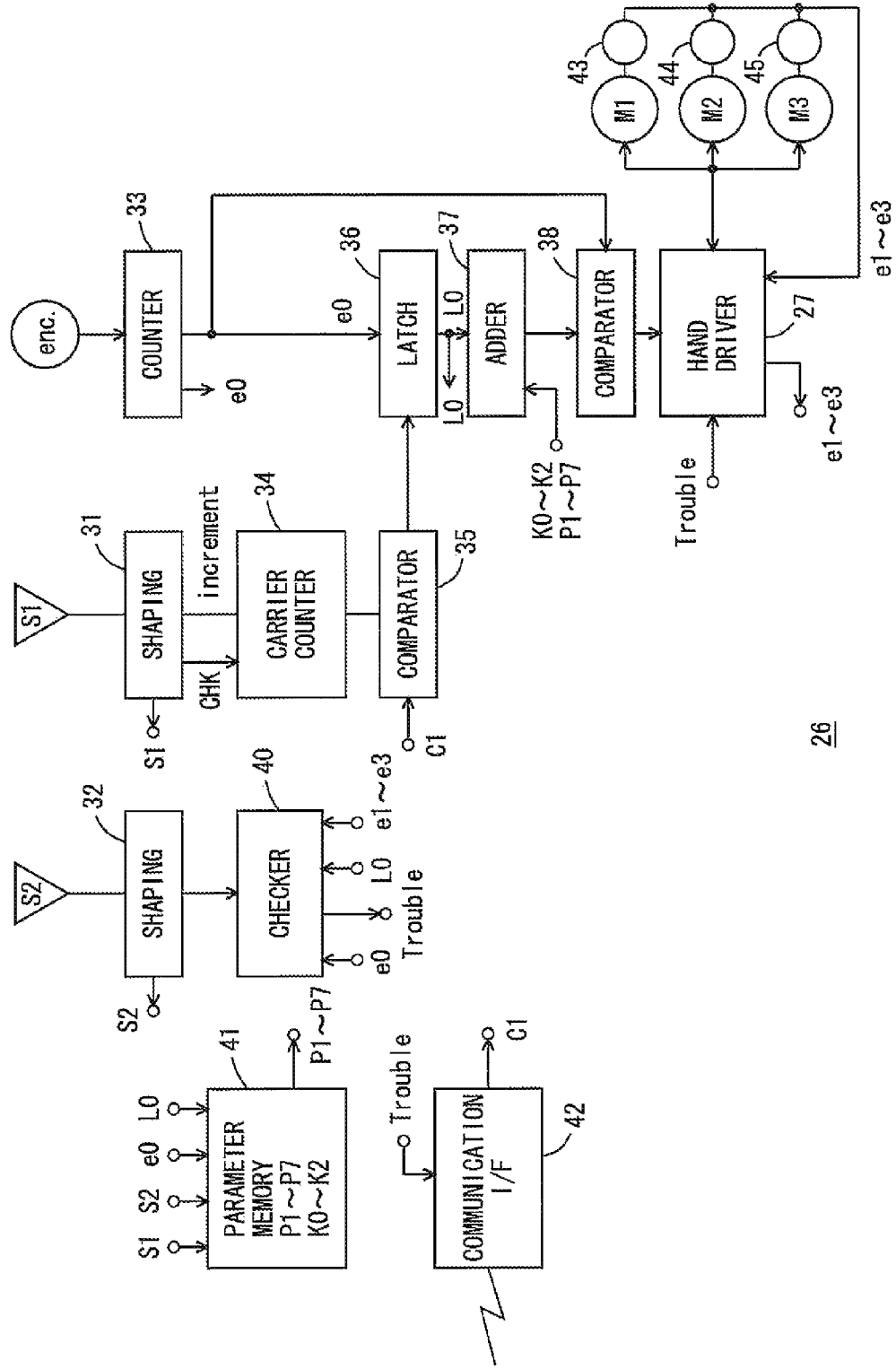
FIG. 3 is a block diagram showing a control system of a station in a preferred embodiment of the present invention.

FIG. 3 shows a structure of the station controller 26. Reference numerals 31, 32 denote shaping circuits. Shaping of signals from the sensors s1, s2 is performed, and a counter 33 counts the output pulses from the encoder. A reference numeral e0 denotes the output from the counter 33. A signal from a carrier counter 34 indicates an address of the carrier. In response to the detection signal indicating detection of the carrier from the sensor s1, the carrier counter 34 increments the carrier number by 1, and checks the validity of the value of the carrier counter 34 based on a check signal which appears at intervals of every eight sensors. If there is any error in the data of the carrier counter 34 for some reason, the check signal does not match the output from the carrier counter 34.

A comparator 35 compares the address of the carrier designated to perform loading or unloading of articles and the output from the carrier counter 34. If the address of the carrier matches the output from the carrier counter 34, the output from the counter 33 at this time point is stored in a latch 36. The output from the latch 36 is denoted by L0. The output from the counter 33 at the moment when the signal of the sensor s1 is turned on is stored. In the case where processing in the carrier counter 34 and the comparator 35 is slow, processing is modified to allow the latching operation to be performed at the rising edge of the output from the shaping circuit 31. A reference numeral 37 denotes an adder that adds calibrated transfer parameters K0 to K2, P1 to P7 stored in a parameter memory 41. When the comparator 38 determines that the signal from the adder 37 matches the signal from the counter 33, the hand is operated by the hand driver 27 accordingly.

In the present preferred embodiment, the hand is operated preferably by three motors M1, M2, and M3. Among these motors M1, M2, and M3, the motors M1, M2 are used to elevate or lower the hand in the height direction. The motor M3 is used to move the hand in the rotation direction in which the endless belt is rotated as indicated by an arrow Y. In the following description, it is assumed that height direction is a direction indicated by an arrow Z. In the present preferred embodiment, the hand is driven along two axes, i.e., in the Y direction and in the Z direction. Further, the hand may be driven additionally in a direction, e.g., indicated by an arrow X, i.e., to move along three axes. Moreover, numbers of rotations of the motors M1 to M3 are monitored by the encoders 43 to 45, and feedback control of the hand is implemented by the signals from encoders 43 to 45. The hand driver 27 uses the output from the encoder enc on the belt side as a trigger to start respective phases of hand operations, and does not use it for feedback control. Thus, the hand can be controlled easily. The outputs from the encoders 43 to 45 are reset each time the hand returns to a position of starting movement (home position) after loading or unloading of articles is finished.

The signals from the latch 36 and the counter 33 are inputted to an encoder checker 40 to examine validity or the like of the encoder enc. That is, the interval between the detection positions of the photoelectric sensor s1 and the photoelectric sensor s2 is known, and the number of output pulses of the encoder corresponding to this interval is stored in the parameter memory 41. The validity of the encoder enc can be checked based on whether the difference between the signal from the counter 33 at the time point when the sensor s2 is operated and the output from the latch 36 corresponds to the interval between the sensors s1, s2. Further, as described later, when the sensor s2 is operated, operation of the hand is started. If the hand is operated according to a target operating pattern, the outputs from the encoders 43 to 45 at this time point must be in a predetermined range. Therefore, operation of the hand is checked based on the signals from the encoders 43 to 45 when the sensor s2 is turned on. If there is any error (difference) greater than an allowable value or more in these items of data, a trouble signal Trouble is outputted from the checker 40, and operation of the hand is stopped.

When the photoelectric sensor s2 is turned on, velocities of the belt and the hand in the Y direction are determined based on the change in the encoder's output per unit time. Matching of these velocities is checked, and if there is an error that is greater than the allowable value, operation of the hand is stopped. This processing may be omitted.

A communication interface (I/F) 42 communicates with the material handling controller 22, and an address of a carrier which requires loading or unloading of cassettes, and a type indicating loading or unloading are inputted. Then, transportation results are transmitted from the communication interface 42 to the material handling controller 22. Further, the trouble signal Trouble is outputted from the checker 40. When the transfer operation is interrupted, information to this effect is reported to the material handling controller 22.

Figure 5:
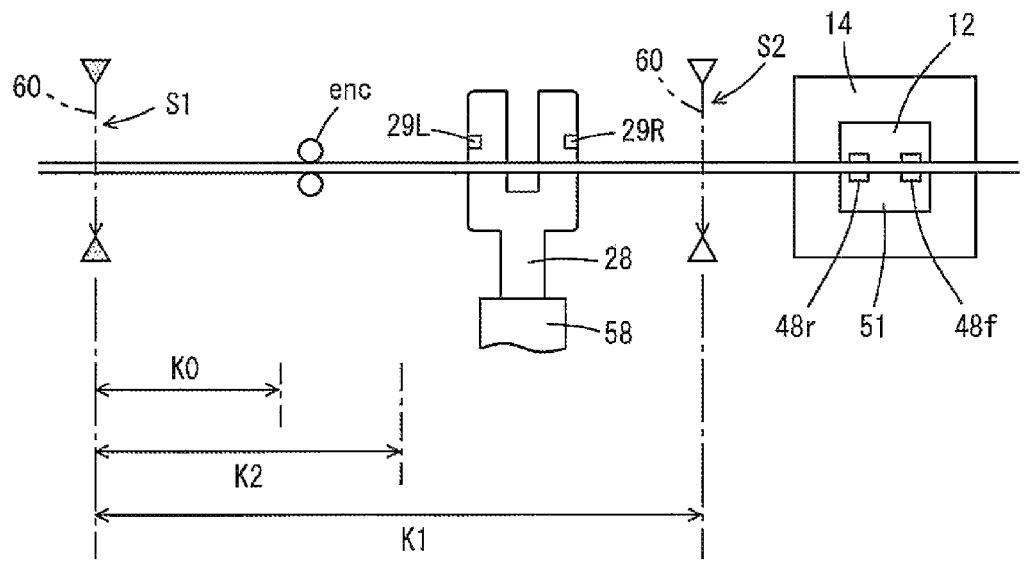
FIG. 5 is a plan view showing main components of the carrier and the hand of the station in a preferred embodiment of the present invention.
Figure 6:
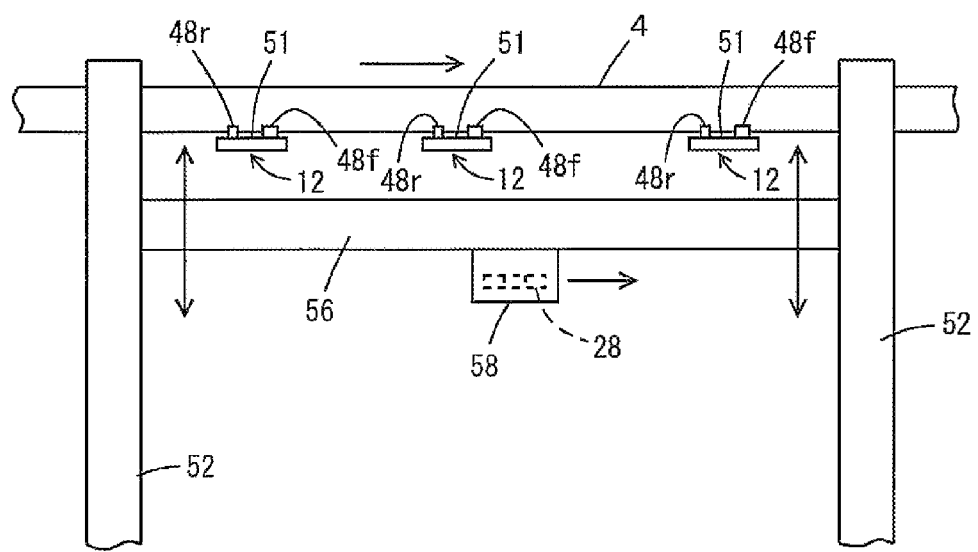
FIG. 6 is a rear view showing main components of the station in a preferred embodiment of the present invention.

FIGS. 4 to 6 show the relationship between the hand 28 and the endless belt 4 at the station 8. As shown in FIG. 4, it is assumed that the rotation direction of the belt 4 is the Y direction, the direction perpendicular to the Y direction in a horizontal plane is the X direction, and the height direction is the Z direction. Further, the hand 28 is operated in the Y direction and the Z direction. The pulley 6 is operated by a driving motor 46 or the like, for example. The carrier 12 includes a pair of front and back attachments 48. Among the attachments 48, an attachment on the front side is denoted by a reference numeral 48f, and an attachment on the back side is denoted by a reference numeral 48r. The carrier 12 includes a carrier body 51 and the attachments 48. A gap between a lower end of the endless belt 4 and an upper end of the carrier body 51 is a watching line 60. At this height, the photoelectric sensors s1, s2 watch the attachments 48f, 48r. The flange 50 of the cassette 14 is placed on a supporting surface 49 of the carrier body 51. A pair of columns 52 are provided on both of left and right sides of the station 8. An elevating and lowering rail 56 is elevated and lowered along a guide groove 54 by motors M1, M2 (not shown). A motor M3 is provided at an upper portion of a hand base 58, and wheels 59 travel within the elevating and lowering rail 56 in the Y direction.

FIG. 5 shows the positional relationship between the photoelectric sensor s1, the hand 28 at the home position, and the photoelectric sensor s2. The encoder enc is preferably positioned adjacent to the station 8. The position of the encoder enc can be determined freely. The home position of the hand 28 is a position where the hand 28 stands by for loading of the articles from, and unloading of the articles to the carrier 12. The endless belt 4 travels from the left side to the right side in FIG. 5. In the case of loading, when the carrier moves forward by KO from the photoelectric sensor s1 based on the number of output pulses from the encoder, the hand 28 is driven. In the case of unloading, when the carrier moves forward from the photoelectric sensor s1 by K2 (K2>K0) based on the number of output pulses, the hand 28 is driven. The interval between the photoelectric sensors s1, s2 is equivalent to K1, in terms of output pulses, where K1>K2>K0.

Figure 7:
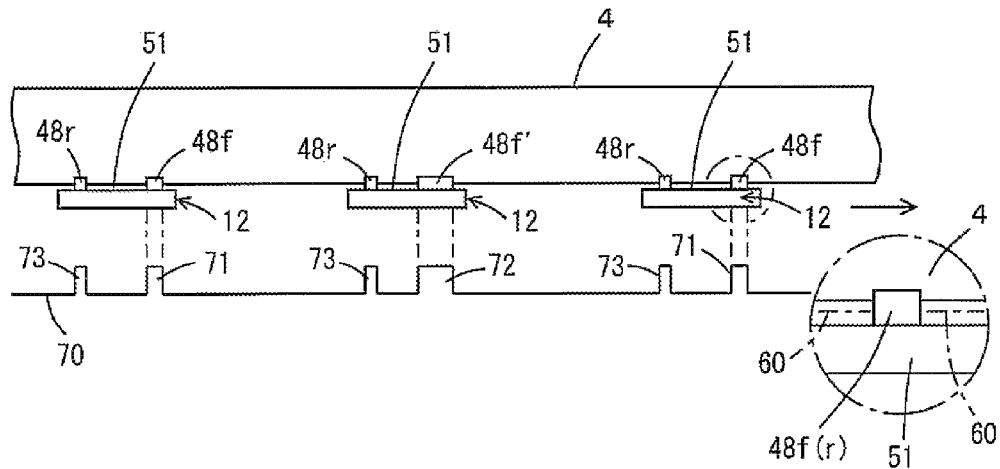
FIG. 7 is a view showing identification of a carrier in a preferred embodiment of the present invention.
Figure 8:
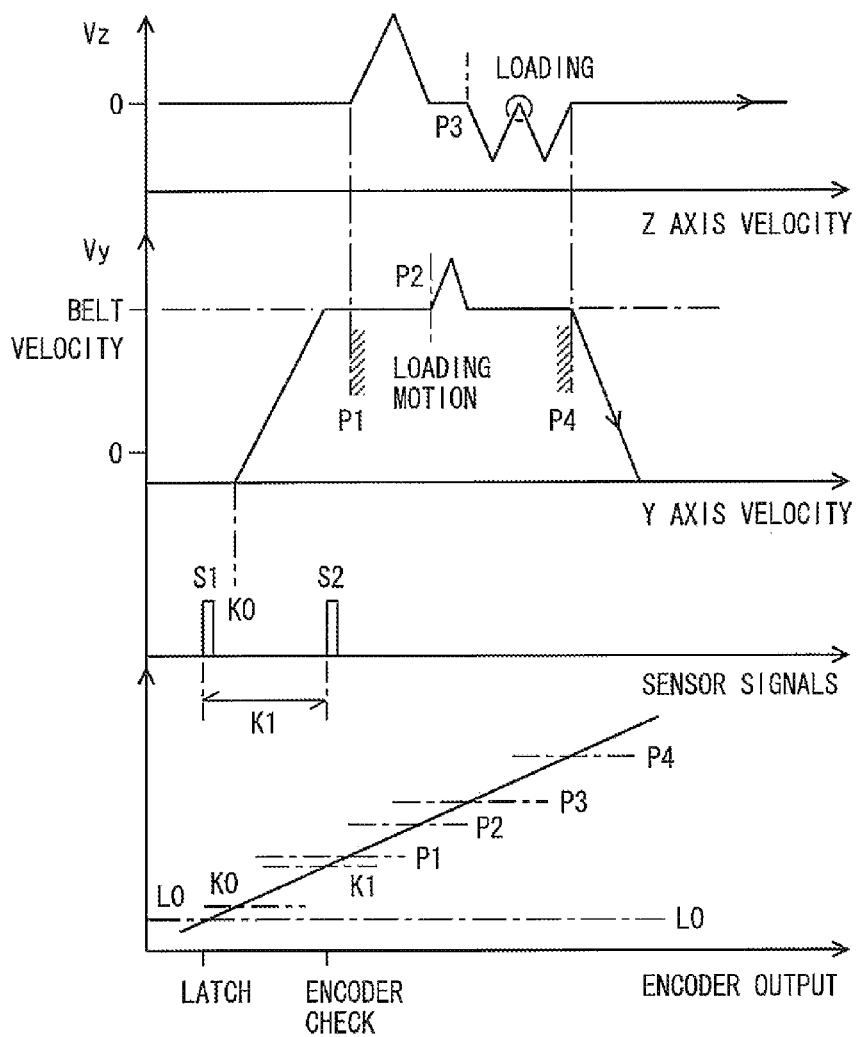
FIG. 8 is a timing chart at the time of loading in a preferred embodiment of the present invention.
Figure 9:
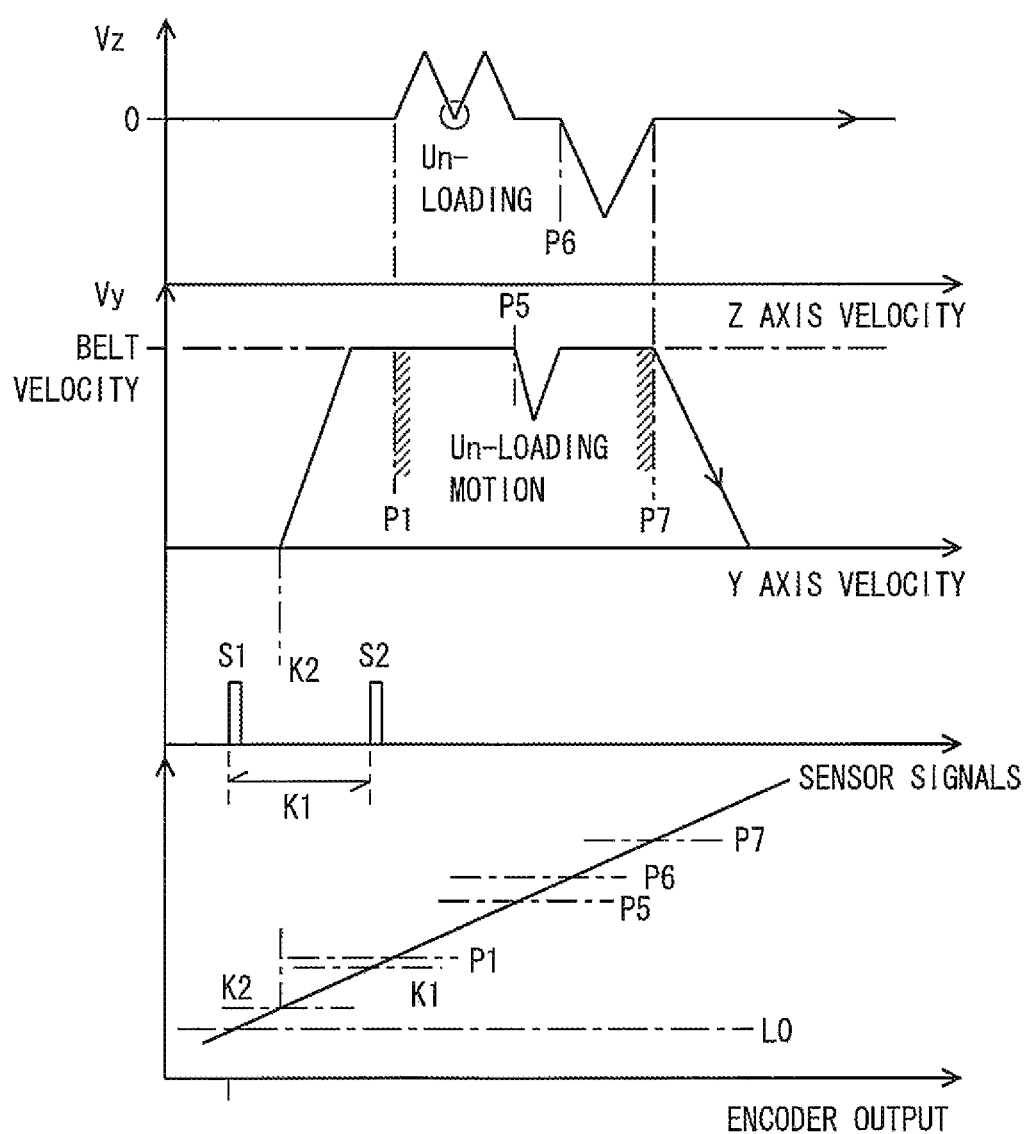
FIG. 9 is a timing chart at the time of unloading in a preferred embodiment of the present invention.
Figure 11:
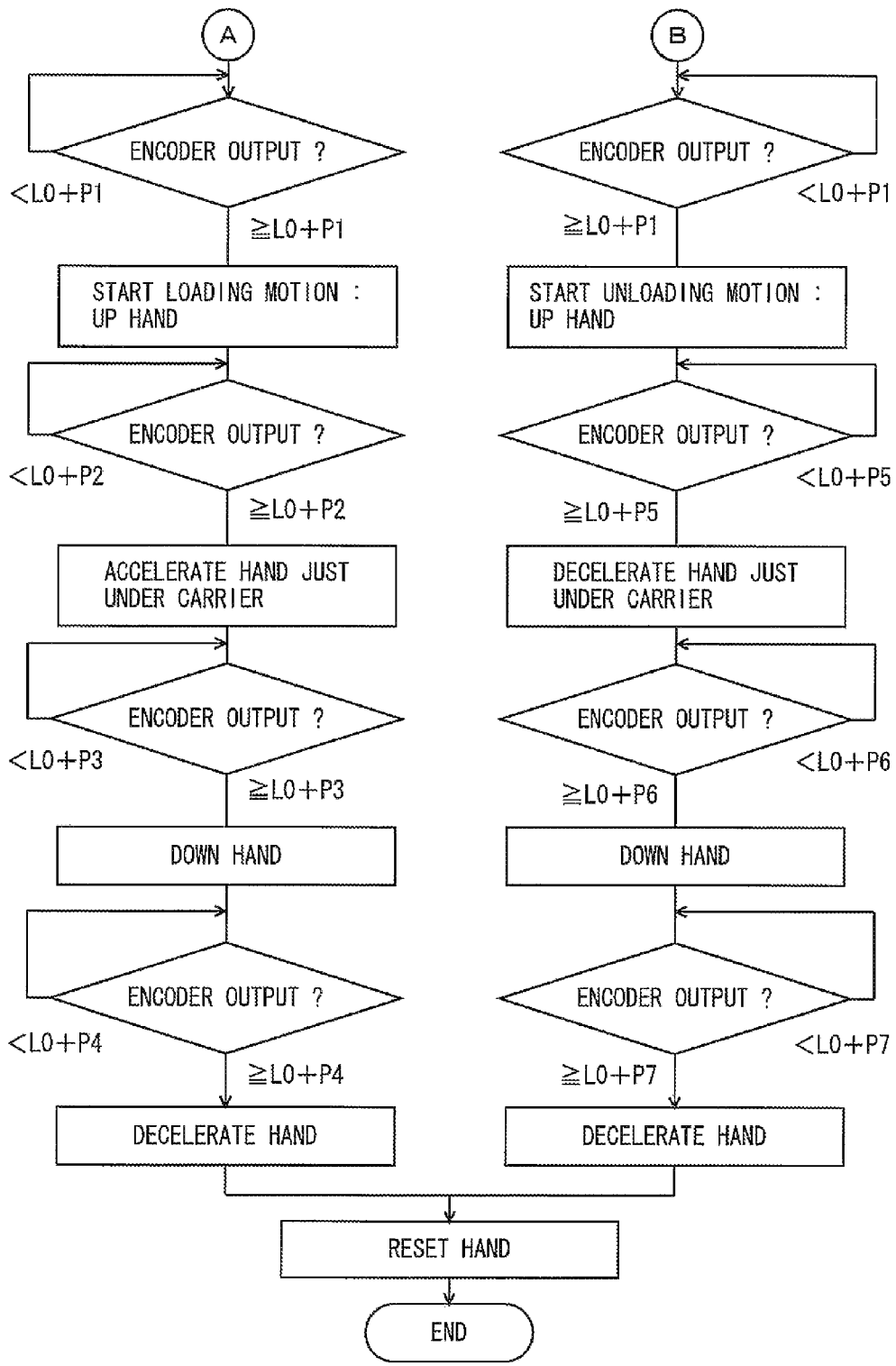
FIG. 11 is a flow chart showing the latter half of the algorithm of loading and unloading in a preferred embodiment of the present invention.

FIG. 7 shows detection and identification of the carrier 12. It is assumed that the endless belt 4 travels from the left side to the right side in FIG. 7 at a constant velocity. The carrier 12 includes the attachment 48f on the front side, and the attachment 48r on the back side. The attachments 48f, 48r have different widths along the travel direction of the belt 4. Further, for example, attachments 48f having a different width along the travel direction of the belt 4 are provided at intervals of every eight carriers. In this preferred embodiment, when the attachments 48f, 48r are detected by the photoelectric sensor s1, a signal shown on the lower side in FIG. 7 is obtained. A reference numeral 70 denotes a baseline of detection signals, and reference numerals 71 to 73 denote the detection signals. Since the attachments 48f and 48r have different widths, the signals 71, 73 have different widths. Next, since the attachments 48f and 48f' have different widths, if the signals 71, 72 have different widths, and the attachment 48f' can be detected. For example, the attachments 48f' are provided at intervals of every eight carriers, the lower three bits of the address of the carrier 12 can be checked. As can be seen from an enlarged view at a lower right position in FIG. 7, the watching line 60 for the attachments 48f, 48r or the like is positioned in a gap in the height direction between the lower end of the belt 4 and the carrier body 51.

FIGS. 8 to 11 show a loading motion (FIG. 8) and an unloading motion (FIG. 9) in the present preferred embodiment, and an algorithm to perform the loading motion and the unloading motion. When the carrier is detected by the photoelectric sensor s1, the count value of the encoder output at this time point is latched. The latched output is denoted by a reference numeral L0. After latching, a preparation period is provided before a starting operation of the hand. In the case of loading, a stand by period of K0 in terms of the number of pulses of the encoder's output is provided, and in the case of unloading, a stand by period of K2 in terms of the number of pulses is provided. Since acceleration at the time of loading is smaller than acceleration at the time of unloading, the number of pulses K0 is smaller than the number of pulses K2. As a result, loading motion and unloading motion as described later can be started at the same position relative to the station. Then, before turning on the photoelectric sensor s2, travel of the hand in the Y direction is started in both of loading and unloading.

At the time point when the photoelectric sensor s2 is turned on, the number of the encoder's output pulses after the photoelectric sensor s1 is turned on is determined, and this number is compared with a predetermined value K1. If the error (difference) from the predetermined value K1 is large, it is considered that sliding or the like occurs in the encoder, and transfer is stopped. Further, at the time point when the photoelectric sensor s2 is turned on, values of the encoders 43, for the driving motor of the hand are checked to confirm whether the hand is operated in accordance with a predetermined operating pattern. That is, it is determined whether the moving distance from the home position matches the position of the photoelectric sensor s2 or not, and it is determined whether moving distances of the two encoders 43, 44 are the same. Further, at this time point, the rotation velocity of the belt is determined from the encoder on the belt side, and specifically, the change per unit time in the output value of the counter 33 is determined. Likewise, the velocity in the Y direction of the hand 28 is determined to check whether it is the same as the velocity of the belt. If the difference between these values is not greater than an allowable value, the hand and the carrier pass through the photoelectric sensor s2 at the same time and at the same velocity. Therefore, it can be confirmed that the hand is ready to be elevated.

After the photoelectric sensor s2 is turned on, at the time when a number of output pulses common to both of loading and unloading is obtained, operation of elevating or lowering the hand is started. Loading motion or unloading motion herein means an operation from the start to the end of elevating or lowering the hand. The count value of the encoder's output pulses at the time of starting loading motion or unloading motion is larger than the latched value L0 by P1. P1 is common to both of loading and unloading. When the carrier comes to a position which is the same as the position of the station, a loading motion or an unloading motion is started.

For this purpose, the area where unloading movement is performed and the area where loading movement is performed are substantially the same with respect to the station.

In the case of loading, the hand is elevated, and when the output value from the counter is increased by P2, the hand is accelerated in the Y direction. The hand and the carrier are overlapped with each other vertically along the Y direction. When the counter value of the encoder's output becomes L0+P3, the hand is started to be lowered. While the hand is being lowered, when the velocity in the Z direction becomes 0, the cassette is loaded from the hand to the carrier. When the counter value of the encoder's output becomes L0+L4, an elevating operation and a lowering operation of the hand are stopped, and the hand is decelerated along the Y direction to escape to the back side of the carrier. When the count value becomes L0+L7, the carrier returns to a predetermined position of the station.

In the case of unloading, elevation of the hand is started when the counter value of the encoder's output becomes L0+L1. While the hand is being elevated, the velocity in the Z direction is once regulated to zero. At this time point, the cassette is unloaded from the carrier to the hand. Then, when the count value becomes L0+P5, the hand is decelerated to escape to the back side of the carrier, and when the count value becomes L0+L6, the hand is lowered. Then, when the counter value becomes L0+L7, the carrier returns to a predetermined position of the station.

In the present preferred embodiment, the following advantages are obtained.

After awaiting movement (moving distance) of the endless belt 4 by the first moving distance or the second moving distance from detection of the carrier by the photoelectric sensor S1, the hand 28 is driven. Therefore, the delay in signal processing after detection of the carrier does not affect activation of the hand. The hand is driven from the upstream side of the second photoelectric sensor, and thus, the hand and the carrier can pass through the second photoelectric sensor S2 at the same time and at the same velocity.

The first moving distance for loading is shorter than the second moving distance for unloading. In the case of loading, the hand is driven earlier than the case of unloading. In the case of loading, acceleration of the hand is small. However, since the hand is accelerated at an earlier stage, substantially the same area can be used for both of loading and unloading of articles. Therefore, for example, the travel stroke of the hand can be shortened, or the area which requires accurate travel control can be shortened. If the travel stroke is shortened, the time used for one loading or one unloading is shortened. As a result, loading or unloading of articles can be performed a larger number of times.

When the carrier is detected by the photoelectric sensor s1, the output L0 of the counter 33 at this time point is latched, and based on the difference from the latched value L0, the hand 28 is controlled. Therefore, in every loading motion, the trajectory of the hand does not change. Likewise, in every unloading motion, the trajectory of the hand does not change. Therefore, the hand can be controlled easily.

Before elevating or lowering the hand 28, the carrier is detected by the photoelectric sensor S2. At this time, the error in the encoder enc is checked, and the position of the hand is checked using the encoders 43, 44 of the motors that drive the hand. Therefore, if there is an error (difference) greater than an allowable value in any of the encoder enc and hand 28, loading or unloading can be cancelled immediately before the operation.

When a moving distance of the carrier from detection of the carrier by the photoelectric sensor S2 reaches a predetermined moving distance, the hand starts to be elevated or lowered. This moving distance is common to both of loading and unloading. Therefore, loading of the article and unloading of the article by elevating or lowering the hand can be performed in substantially the same area.

When the carrier is detected by the photoelectric sensor s2, the position of the hand in the Y direction at this time point is determined to check whether the hand is positioned at the photoelectric sensor s2. As a result, it can be checked whether the hand is operated properly or not, and whether the hand and the carrier are present at the same position in the Y direction.

At the position of the photoelectric sensor s2, since it is checked whether the carrier and the hand are present at the same position and moving at the same velocity, matching of both of the position and the velocity in the Y direction can be confirmed.

Wide allowable ranges can be adopted for the change in the velocity of the endless belt 4, and the change in the velocity of the carrier. That is, the carrier is detected twice by the photoelectric sensors S1, S2. The moving distance of the endless belt 4 determined by the encoder enc in this period is compared with the distance between the photoelectric sensors S1, S2 in order to confirm whether the encoder enc is normal or not. The subsequent control of the hand can be carried out based on the data of the encoder enc. Thus, even if the velocity of the endless belt 4 changes, influence by the change can be reduced.

In the present preferred embodiment, though the photoelectric sensors S1, S2 of a through-beam type are preferably used as the carrier sensors, the type of sensors and measurement principle can be adopted freely. When the carrier passes through the position of the photoelectric sensor s2, if there is any error within an allowable value on the belt side, the control of the hand may be modified to compensate for the error. If there is any error within the allowable value on the hand side, for example, control of the hand is changed to eliminate the error.

DESCRIPTION OF REFERENCE NUMERALS

2: transport system
4: endless belt
6, 6a, 6b: pulley
8: station
10: processing tool
12: carrier
14: cassette
20: manufacturing execution controller
22: material handling controller
24: endless belt driver
26: station controller
27: hand driver
28: hand
29R, 29L: occupation sensor
31, 32: shaping circuit
33: counter
34: carrier counter
35: comparator
36: latch
37: adder
38: comparator
40: encoder checker
41: parameter memory
42: communication I/F
43 to 45: encoder
46: driving motor
48, 48f, 48r: attachment
49: supporting surface
50: flange
51: carrier body
52: column
54: guide groove
56: elevating and lowering rail
58: hand base
59: wheel
60: watching line
70: baseline
71 to 73: detection signal
80, 90: carrier
91, 92: attachment
94: optical mark
S1, s2: photoelectric sensor enc: encoder
M1 to M3: motor
P1 to P7: parameter
K0 to K2: parameter While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system comprising:
an endless driving medium configured to rotate in a circulating manner;
a plurality of carriers attached to the endless driving medium and configured to hold articles for transportation;
a plurality of stations provided along the endless driving medium; and
a moving distance sensor configured to measure a moving distance of the endless driving medium; wherein
each of the plurality of stations includes:
a hand configured to load articles to and unload articles from the carriers;
a driver configured to move the hand both in a rotation direction of the endless driving medium and in a vertical direction;
a first carrier sensor configured to detect the carriers at a predetermined position upstream of the hand along the rotation direction of the endless driving medium;
a second carrier sensor configured to detect the carriers at a position downstream of the first carrier sensor; and
a signal processor configured to make the driver drive the hand based on the moving distance measured by the moving distance sensor, from detection of the carriers by the first carrier sensor; wherein
the signal processor evaluates a difference between the moving distance measured by the moving distance sensor from detection of the carriers by the first carrier sensor and a distance between the first carrier sensor and the second carrier sensor at the second carrier sensor detecting the carriers, and if the difference is greater than an allowable value, the signal processor stops movement of the hand by the driver.

2. The transport system according to claim 1, wherein the first carrier sensor detects the carriers at a predetermined position downstream of a position of starting movement of the hand, and the hand is driven after detection of the carriers by the first carrier sensor and before detection of the carriers by the second carrier sensor.

3. The transport system according to claim 2, further comprising a second moving distance sensor configured to measure a moving distance from a position of starting movement of the hand;
at the second carrier sensor detecting the carriers, the signal processor evaluates a difference between the moving distance measured by the second moving distance sensor and a predetermined moving distance, and with the difference greater an allowable value, the signal processor makes the driver stop the hand.

4. The transport system according to claim 3, wherein the driver drives the hand to pass the second carrier sensor at a same time and at a same velocity with the carrier.

5. A transport method comprising the steps of:
attaching a plurality of carriers to hold articles to an endless driving medium configured to rotate in a circulating manner, providing a plurality of stations along the endless driving medium;
measuring a moving distance of the endless driving medium;
providing a hand being configured to load articles and to unload articles from the carriers for each of the plurality of stations;
detecting the carriers by a first carrier sensor at a predetermined position upstream of the hand along a rotation direction of the endless driving medium;
detecting the carriers by a second carrier sensor at a position downstream of the first carrier sensor;
driving the hand by the driver based on the moving distance of the endless driving medium, from detection of the carriers by the first carrier sensor; and evaluating a difference between the moving distance of the endless driving medium from detection of the carriers by the first carrier sensor and a distance between the first carrier sensor and the second carrier sensor at the second carrier sensor detecting the carrier, and if the difference is greater than an allowable value, stopping movement of the hand by the driver.

* * * * *